United States Patent
Corona et al.

(10) Patent No.: US 7,871,894 B2
(45) Date of Patent: Jan. 18, 2011

(54) PROCESS FOR MANUFACTURING THICK SUSPENDED STRUCTURES OF SEMICONDUCTOR MATERIAL

(75) Inventors: Pietro Corona, Milan (IT); Flavio Francesco Villa, Milan (IT); Gabriele Barlocchi, Cornaredo (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 727 days.

(21) Appl. No.: 11/541,376

(22) Filed: Sep. 27, 2006

(65) Prior Publication Data

US 2007/0126071 A1 Jun. 7, 2007

(30) Foreign Application Priority Data

Sep. 28, 2005 (EP) .................................. 05425676

(51) Int. Cl.
H01L 21/76 (2006.01)

(52) U.S. Cl. ................. 438/411; 438/53; 257/E21.564; 257/E21.573

(58) Field of Classification Search ................... 438/50, 438/51–53, 48, 411, 415, 419, 416; 73/146.4; 257/E21.564, E23.128, E21.566, E21.561, 257/E21.573
See application file for complete search history.

(56) References Cited

U.S. PATENT DOCUMENTS

| | | | |
|---|---|---|---|
| 6,208,007 B1 * | 3/2001 | Babic et al. ................. 257/466 |
| 6,518,147 B1 * | 2/2003 | Villa et al. ................... 438/429 |
| 6,787,052 B1 | 9/2004 | Vaganov |
| 6,790,751 B2 * | 9/2004 | Tsuruta et al. ............... 438/524 |
| 6,833,079 B1 * | 12/2004 | Giordani ......................... 216/2 |
| 6,870,445 B2 * | 3/2005 | Kawakubo et al. .......... 333/187 |
| 7,164,188 B2 * | 1/2007 | Farrar et al. .................. 257/621 |
| 7,354,786 B2 * | 4/2008 | Benzel et al. .................. 438/50 |
| 7,537,989 B2 * | 5/2009 | Nakai et al. .................. 438/218 |

(Continued)

FOREIGN PATENT DOCUMENTS

EP 1577656 9/2005

OTHER PUBLICATIONS

Sato T et al., "Fabrication of Silicon-on-Nothing Structure by Substrate Engineering Using the Empty-Space-in-Silicon Formation Technique", Japanese Journal of Applied Physics, Japan Society of Applied Physics, Tokyo, JP, vol. 43, No. 1, Jan. 2004, pp. 12-18, XP001191452.

(Continued)

*Primary Examiner*—Matthew C Landau
*Assistant Examiner*—Latanya Crawford
(74) *Attorney, Agent, or Firm*—Lisa K. Jorgenson; Kevin D. Jablonski; Graybeal Jackson LLP

(57) ABSTRACT

A process for manufacturing a suspended structure of semiconductor material envisages the steps of: providing a monolithic body of semiconductor material having a front face; forming a buried cavity within the monolithic body, extending at a distance from the front face and delimiting, with the front face, a surface region of the monolithic body, said surface region having a first thickness; carrying out a thickening thermal treatment such as to cause a migration of semiconductor material of the monolithic body towards the surface region and thus form a suspended structure above the buried cavity, the suspended structure having a second thickness greater than the first thickness. The thickening thermal treatment is an annealing treatment.

26 Claims, 2 Drawing Sheets

U.S. PATENT DOCUMENTS

| | | | | |
|---|---|---|---|---|
| 2003/0111665 A1* | 6/2003 | Geusic et al. | ................. | 257/64 |
| 2003/0168711 A1* | 9/2003 | Villa et al. | ................. | 257/506 |
| 2003/0181018 A1* | 9/2003 | Geusic et al. | ............... | 438/422 |
| 2004/0129998 A1* | 7/2004 | Inoh et al. | ................... | 257/501 |
| 2004/0227207 A1* | 11/2004 | Barlocchi et al. | ........... | 257/510 |
| 2004/0251781 A1* | 12/2004 | Bouche et al. | .............. | 310/324 |
| 2005/0067294 A1* | 3/2005 | Choe et al. | .................. | 205/157 |
| 2005/0172717 A1* | 8/2005 | Wu et al. | ................. | 73/514.34 |
| 2007/0020876 A1* | 1/2007 | Blomiley et al. | ............ | 438/424 |

OTHER PUBLICATIONS

European Search Report for EP 05 42 5676 dated Jan. 11, 2006.

* cited by examiner

US 7,871,894 B2

PROCESS FOR MANUFACTURING THICK SUSPENDED STRUCTURES OF SEMICONDUCTOR MATERIAL

PRIORITY CLAIM

This application claims priority from European patent application No. 05425676.3, filed Sep. 28, 2005, which is incorporated herein by reference.

TECHNICAL FIELD

An embodiment of the present invention relates to a process for manufacturing thick suspended structures of semiconductor material, in particular that can be used as inertial (or seismic) masses in micro-electromechanical devices such as integrated accelerometers, to which the following description will make reference without this, however, implying any loss in generality.

BACKGROUND

Processes for manufacturing thick suspended structures of semiconductor material are known to the art. Said processes initially envisage providing a layer of semiconductor material, and etching the layer of semiconductor material from the back, for example via an anisotropic wet chemical etch in TMAH (Tetra-Methyl Ammonium Hydroxide), so as to define a thick structure having a desired shape. Then, a covering layer is joined, for example via anodic bonding, to the layer of semiconductor material, underneath the structure previously defined. In particular, the covering layer has a recess in a position corresponding to said structure so that, following upon bonding between the two layers, the structure will be suspended above a cavity.

By way of example, FIG. 1 shows an accelerometer 1 of a piezoresistive type, comprising a thick suspended structure, in particular an inertial mass, made as described above.

In detail, the accelerometer 1 comprises a first layer 2 and a second layer 3, bonded to one another, for example, via anodic bonding. The first layer 2 is made of semiconductor material, whilst the second layer 3 may be made of semiconductor material, or, alternatively, of glass or plastic.

The first layer 2 comprises a bulk region 4 and an inertial mass 5, mechanically connected to the bulk region 4 via thin and deformable connection structures 6. The inertial mass 5 is formed via a TMAH etching of the first layer 2, made from the back; with the same etching the connection structures 6 are defined. The second layer 3 has a function of covering and mechanical support, and has a cavity 8, in a position corresponding to the inertial mass 5, so as to ensure freedom of movement for the inertial mass 5. Piezoresistive detection elements 9, for example constituted by regions doped by diffusion, are made in the connection structures 6 and connected in a bridge circuit.

During operation, an acceleration sensed by the accelerometer 1 causes a displacement of the inertial mass 5. Consequently, the connection structures 6, fixed to the inertial mass 5, undergo deformation, and the resistivity of the piezoresistive detection elements 9 varies accordingly, unbalancing the bridge circuit. Said unbalancing is then detected by a suitable electronic circuit, which derives therefrom the desired acceleration measurement.

The described manufacturing process is rather complex, due to the presence of a wet etching to be carried out from the back of a layer of semiconductor material, and the need to provide a bonding with a covering layer. For this reason, micro-electromechanical devices comprising suspended structures formed through said process may be characterized by large overall dimensions and high costs.

SUMMARY

An embodiment of the present invention is a process for manufacturing thick suspended structures of semiconductor material that will enable the aforementioned disadvantages and problems to be overcome, and in particular that will have a reduced complexity and lower production costs.

Consequently, according to an embodiment of the present invention, a process for manufacturing a suspended structure of semiconductor material and a semiconductor structure comprising a suspended structure of semiconductor material are provided.

BRIEF DESCRIPTION OF THE DRAWINGS

For a better understanding of embodiments of the present invention, an embodiment is now described, purely by way of non-limiting example and with reference to the attached drawings.

DETAILED DESCRIPTION

A process for manufacturing thick suspended structures of semiconductor material is now described. This process is based, in part, upon the process described in the European patent application 04 425 197.3, which is incorporated by reference.

Figure 1:
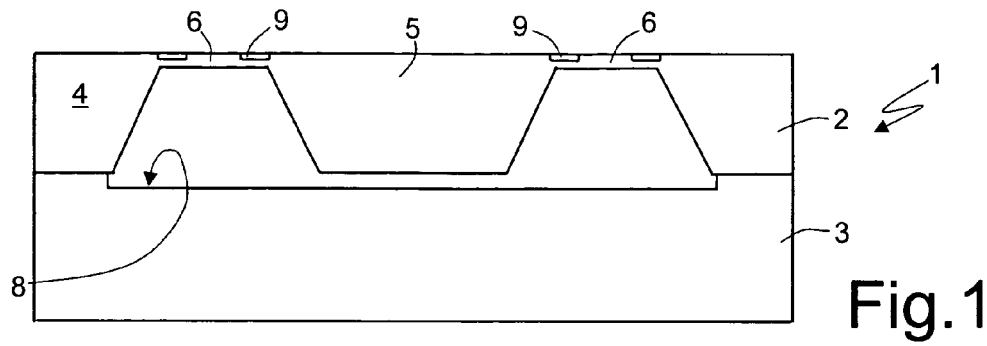
FIG. 1 is a cross-sectional view of a micro-electromechanical structure of a known type.
Figure 2:
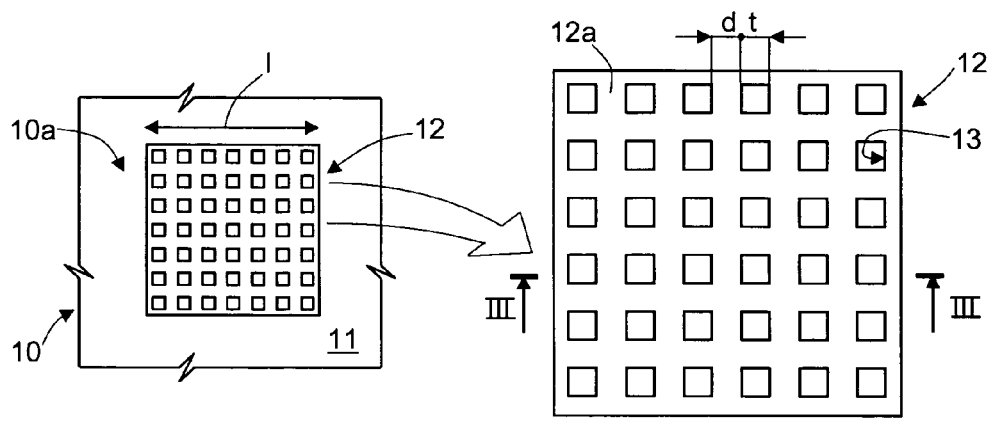
FIG. 2 is a top plan view of a wafer of semiconductor material, in an initial step of a process for manufacturing a suspended structure, according to an embodiment of the present invention.

FIG. 2 (which, like the subsequent figures, is not drawn to scale) shows a wafer 10 of semiconductor material, in particular monocrystalline silicon of an N type with (100) orientation of the crystallographic plane, which comprises a bulk region 1.

Figure 3:
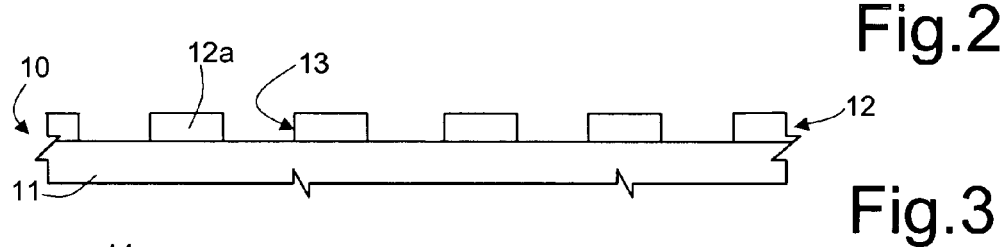
FIG. 3 is a cross-sectional view at an enlarged scale of details of the wafer of FIG. 2, taken along the line III-III, according to an embodiment of the invention.

In an initial step of the manufacturing process, a resist layer is deposited on a top surface 10a of the wafer 10, and it is defined so as to form a mask 12 (see also the cross-sectional view of FIG. 3). In detail, the mask 12 covers an approximately square area having sides I of, for example, 300 μm, with the sides parallel to the flat (110) of the wafer 10. The mask 12 has a lattice structure 12a (as may be seen from the enlarged detail of FIG. 2), defining a plurality of openings 13 of an approximately square shape. The openings 13 have sides t of approximately one micron, for example, 0.8 μm, and the distance d between opposite sides of adjacent openings 13 is also approximately one micron, for example, 0.8 μm.

Figure 4:
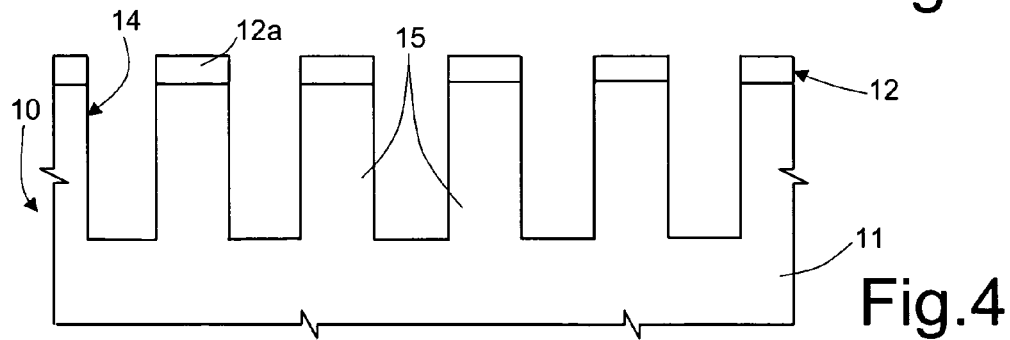
FIGS. 4-8 are cross-sectional views of the wafer of semiconductor material in subsequent steps of the manufacturing process according to an embodiment of the invention.

Using the mask 12 (FIG. 4), an anisotropic dry chemical etching of the wafer 10 is then carried out, to form deep trenches 14 in a position corresponding to the openings 13. The depth of the deep trenches 14 is of the order of microns or of tens of microns (for example, 10 μm), and the deep trenches 14 are separated from one another by walls 15 of semiconductor material, which form together a single separation structure, having a section corresponding to the lattice structure 12a.

Figure 5:
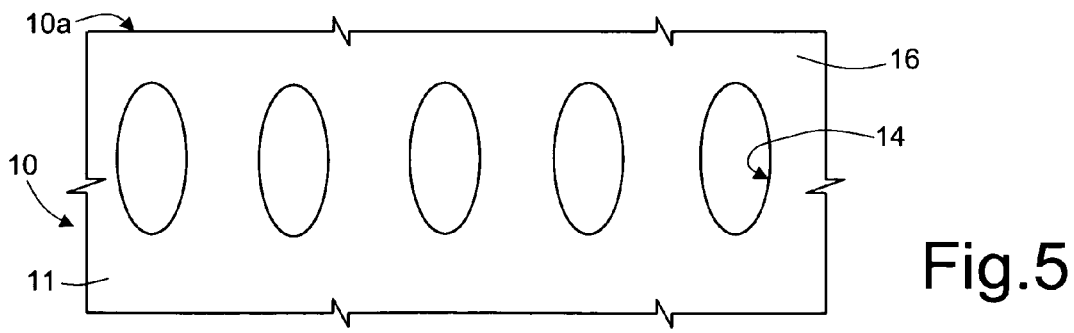

Next, the mask 12 is removed, and an epitaxial growth is performed in a de-oxidizing atmosphere (typically, in an atmosphere with a high hydrogen concentration, preferably with trichlorosilane—SiHCl$_3$). Due to the epitaxial growth, a silicon closing layer 16 is formed (shown only in FIG. 5), which has a thickness of the order of microns (for example, 5 µm) and closes the deep trenches 14 at the top, entrapping the gas present therein. In particular, before the deep trenches 14 are closed at the top, a growth of silicon occurs therein, causing a reduction in the dimensions of said trenches. At the end of the epitaxial growth, the deep trenches 14 consequently have an oval cross section elongated in a direction perpendicular to the top surface 10a.

A first thermal annealing treatment is then carried out in an atmosphere containing hydrogen or another inert gas (for example, nitrogen or argon) or else a combination of hydrogen and of another inert gas, at high temperature (around or higher than 1000° C.) for a first time interval, which lasts some minutes or some tens of minutes. Advantageously, the first thermal annealing treatment is carried out in a hydrogen atmosphere, at a temperature of 1200° C., and the first time interval is no longer than 30 minutes.

Figure 6:
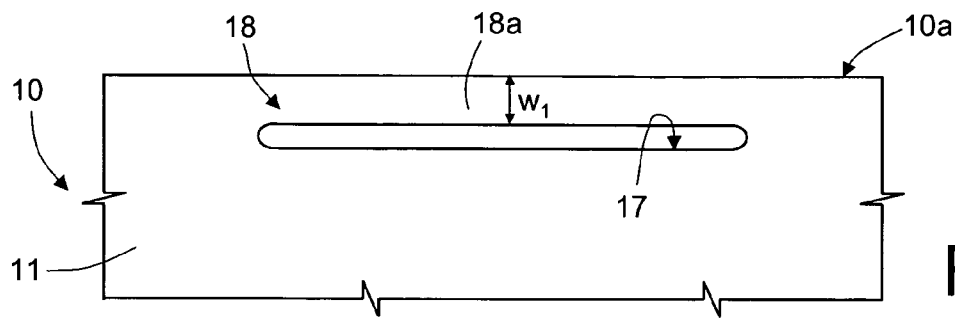

The high temperature promotes a migration of the silicon atoms of the walls 15, which tend to move into a position of lower energy. In particular, the silicon atoms migrate through adjacent lattice positions, preserving the lattice structure of perfect crystal of the silicon. On account of said migration, the individual deep trenches 14 evolve towards conformations with lower surface energy, for example, from oval shapes to shapes of a spherical type, and then merge together to form a single buried cavity 17, which is uniform and entirely contained and insulated within the wafer 10 (FIG. 6). For example, the buried cavity 17 has a thickness of 2 µm and a square cross section with sides of 300 µm. The main internal walls, i.e., the top and bottom walls, of the buried cavity 17 are substantially parallel to one another and to the top surface 10a of the wafer 10. A surface region 18 of semiconductor material remains above the buried cavity 17; this surface region 18 is constituted in part by epitaxially grown silicon atoms and in part by migrated silicon atoms, and has a first thickness $w_1$ (in a direction orthogonal to the top surface 10a). For example, said surface region 18 can form a thin membrane, which is suspended in a flexible and deformable way above the buried cavity 17.

Next, according to an embodiment of the present invention, a second thermal annealing treatment is carried out at high temperature (around or above 1000° C.) for a second time interval, having a duration of tens of minutes or of some hours. The conditions and operative parameters of the second thermal annealing treatment may coincide with those of the first thermal treatment; i.e., the second treatment may also made in hydrogen atmosphere and at a temperature of 1200° C.; in addition, the duration of the second time interval may be longer than 30 minutes.

Figure 7:
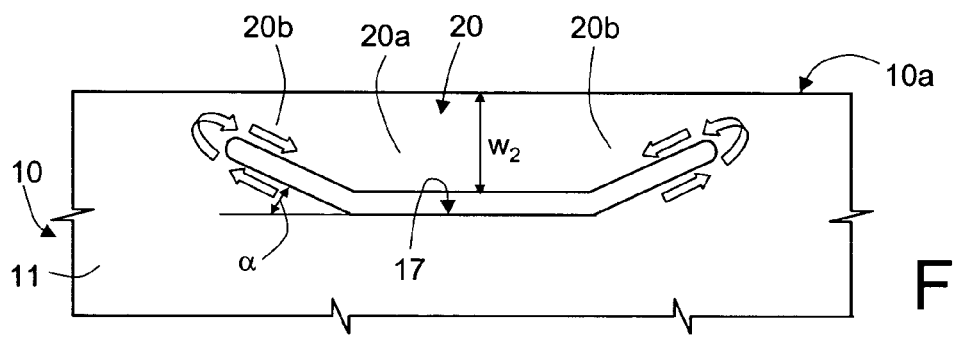

Due to the second thermal annealing treatment, a further migration of the silicon atoms occurs: in particular, the silicon atoms of the bulk region 1 that "face" the inside of the buried cavity 17 migrate and are displaced, in the direction indicated by the arrows in FIG. 7, towards a central portion 18a of the surface region 18. The resulting effect is that, whereas the ends of the buried cavity 17 remain substantially at the same depth with respect to the top surface 10a of the wafer 10, the centre of the buried cavity 17 progressively shifts towards the bulk region, moving away from the top surface 10a. The buried cavity 17 consequently assumes a profile having, in a section orthogonal to the top face 10a, a central stretch substantially parallel to the top face 10a, and lateral stretches, joined to the central stretch, inclined with respect to the top face 10a by an angle α of approximately 30°. The thickness of the central portion 18a of the surface region 18 progressively increases, and the surface region 18 is "strengthened" until it forms a suspended structure 20, of large thickness (i.e., of tens of microns, for instance, more than 10 µm, or, more than 50 µm), above the buried cavity 17. In particular, the suspended structure 20 has a central portion 20a and lateral portions 20b, which surround the central portion 20a. The central portion 20a has a second thickness $w_2$ greater than the thickness of the lateral portions 20b and than the first thickness $w_1$ of the surface region 18. In addition, the suspended structure 20 has a bottom portion (adjacent to the buried cavity 17) having substantially the shape of a truncated pyramid turned upside down, and a top portion (adjacent to the top surface 10a) substantially corresponding to the surface region 18. In particular, the side walls of the truncated pyramid are inclined by the angle α (of 30°) with respect to the top surface 10a of the wafer 10, and the height of the pyramid is equal to the difference $w_2-w_1$ between the second thickness and the first thickness.

Figure 8:
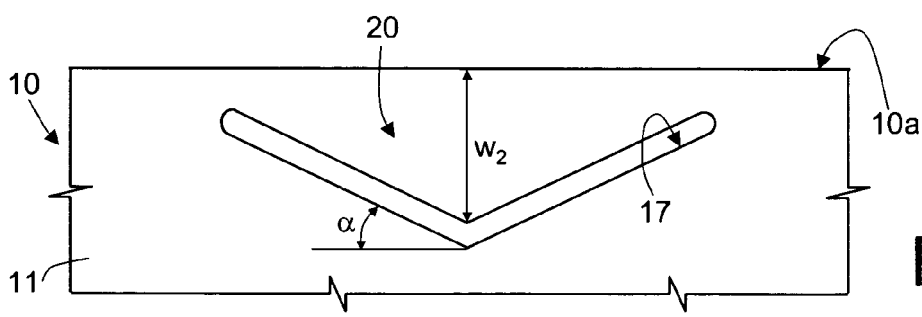

Proceeding further with the second thermal annealing treatment, the migration of the silicon atoms continues, and thus the dimensions of the inclined side walls and the second thickness $w_2$ of the suspended structure 20 increase, until the semiconductor structure of FIG. 8 is obtained, with the suspended structure 20 that has a bottom portion having substantially the shape of a pyramid turned upside down, and with the buried cavity 17 that has a V-shaped profile in a section transverse to the top face 10a.

The second thickness $w_2$, as likewise the shape (whether of a truncated pyramid or of a pyramid), of the suspended structure 20 is consequently a function of the duration of the second time interval, i.e., of the duration of the second thermal annealing treatment: for example, in one embodiment FIG. 7 corresponds to a duration of 60 minutes, whilst FIG. 8 corresponds to a duration of 6 hours. The value of the second time interval that leads to the formation of the suspended structure of FIG. 8 (i.e., to the end of the process of migration of the silicon atoms) depends, as may be inferred, upon the starting dimensions of the surface region 18a, or, in a similar way, upon the sides I of the mask 12. In addition, also the value of the second thickness $w_2$ at the end of the process of migration is linked to the dimensions of the surface region 18a by simple trigonometric relations; for example, given a side I of 300 µm, said value is approximately equal to 90 µm.

Advantageously, given the substantial uniformity of conditions and of operating parameters of the first and second thermal annealing treatments, just one thermal annealing treatment may be carried out, so that the second treatment is a continuation of the first treatment, with a total duration of the single thermal annealing treatment equal to the sum of the first and second time intervals. In general, said total duration is more than 30 minutes, for example between 60 and 600 minutes. The formation of the surface region 18 is in this case only an initial step of a single migration process of the silicon atoms, which then leads to the formation of the suspended structure 20.

The suspended structure 20 can advantageously be used within a micro-electromechanical structure, for example as inertial mass in an accelerometer. In this case, in a way not illustrated, the manufacturing process can proceed with the formation of thin and deformable connection structures between the suspended structure and the bulk region 11 of the wafer 10, and with the formation of transduction elements, for example of a piezoresistive type, in said connection structures.

The described manufacturing process has numerous advantages.

In particular, it does not involve bonding steps, in so far as the suspended structure 20 and the underlying buried cavity are formed within a single monolithic body of semiconductor material, with advantages in terms of manufacturing costs and complexity.

The suspended structure 20 can thus advantageously be used in semiconductor structures, for example as inertial mass in accelerometers of a resistive or capacitive type, or else in cantilever accelerometers (in this latter case, the suspended structure 20 is carried by a beam, in a position corresponding to one end thereof, and is suspended above the buried cavity). The resulting semiconductor structures have small overall dimensions, given the absence of bonding between different layers and of wet etches carried out from the back.

It is moreover possible to control the thickness (and the shape) of the resulting suspended structures in a precise way according to the duration of the thermal annealing treatment.

The manufacturing process described enables integration of integrated circuits of a CMOS type within the suspended structure 20 (in a per se known manner which is not illustrated).

Finally, modifications and variations may be made to what is described and illustrated herein, without thereby departing from the scope of the present invention.

For example, the step of epitaxial growth that leads to closing of the deep trenches 14 at the top (FIG. 5) may not be envisaged. In fact, it is possible to obtain closing of the deep trenches 14 via the subsequent thermal annealing treatment and the consequent migration of the silicon atoms of the walls 15.

In the described manufacturing process wafers of semiconductor material of a P type, instead of an N type, may be used in an altogether equivalent way. The orientation of the crystallographic plane is advantageously (100), in so far as experimental tests have sometimes shown difficulty in obtaining the same structures starting from wafers with (111) orientation. In particular, in the case of (111) orientation, the deep trenches 14 may not merge into a single buried cavity 17 during the thermal annealing treatment.

As an alternative to what has been described, via the mask 12 a hard mask can be obtained, for example made of oxide, which can then be used for the etching of the wafer 10 that leads to the formation of the deep trenches 14.

The structure of the mask 12 (or, in an equivalent way of the aforesaid hard mask) and the shape of the walls 15 and of the deep trenches 14 can vary with respect to what is illustrated. For example, the mask 12 can have a structure that is complementary to the one illustrated in FIG. 2 and can comprise a plurality of portions of a polygonal shape (for example, square or hexagonal), arranged in a regular way to define an opening shaped like a (square or honeycomb) lattice. More in general, the walls 15 can be constituted by thin structures capable of enabling complete migration of the silicon atoms during the annealing step that leads to the formation of the buried cavity 17. The masks 12 having a lattice structure are, however, the most advantageous for use in the manufacturing process described.

Finally, the area over which the mask 12 extends may have different shapes; for example, it may have a rectangular or a generically polygonal shape.

Moreover, the structure 10, or a die or IC in which the structure is located, may compose part of an electronic system such as the air-bag-firing system of an automobile.

The invention claimed is:

1. A process for manufacturing a suspended structure of semiconductor material, comprising:
    providing a monolithic body of semiconductor material having a front face;
    forming a buried cavity within said monolithic body, said buried cavity extending at a distance from said front face and delimiting, with said front face, a surface region of said monolithic body having a first thickness; and
    carrying out a thickening thermal treatment such as to cause a migration of semiconductor material of said monolithic body towards said surface region and thus form a suspended structure above said buried cavity, said suspended structure having a second thickness greater than said first thickness.

2. The process according to claim 1, wherein said step of forming a buried cavity comprises:
    forming trenches within said monolithic body, delimiting separation structures of semiconductor material; and
    carrying out an initial thermal treatment, such as to cause migration of the semiconductor material of said separation structures and transformation of said trenches into said buried cavity, said buried cavity being contained and insulated within said monolithic body.

3. The process according to claim 1, wherein, at the end of said step of forming a buried cavity, said buried cavity has main internal walls substantially parallel to one another and to said front face of said monolithic body; and wherein said second thickness is greater than 10 μm.

4. The process according to claim 1, wherein said monolithic body comprises a bulk region, and the migration due to said thickening thermal treatment involves semiconductor material of said bulk region, which migrates towards a central portion of said surface region, said suspended structure having a central portion and lateral portions surrounding said central portion; said central portion having substantially said second thickness, and said lateral portions having a thickness smaller than that of said central portion.

5. The process according to claim 1, wherein said step of carrying out a thickening thermal treatment comprises controlling the duration of said thickening thermal treatment as a function of a desired value of said second thickness.

6. The process according to claim 1, wherein said monolithic body comprises monocrystalline silicon with orientation of the crystallographic plane.

7. The process according to claim 2, wherein said thickening thermal treatment is a continuation of said initial thermal treatment, said thickening thermal treatment and said initial thermal treatment forming a single thermal treatment.

8. The process according to claim 2, wherein said thickening thermal treatment and said initial thermal treatment comprise a respective annealing treatment.

9. The process according to claim 2, wherein the duration of said initial thermal treatment is shorter than the duration of said thickening thermal treatment; in particular, the duration of said initial thermal treatment being no longer than 30 minutes, and the duration of said thickening thermal treatment being longer than 30 minutes.

10. The process according to claim 2, further comprising epitaxially growing, starting from said separation structures, a closing layer of semiconductor material above said trenches, before carrying out said initial thermal treatment.

11. The process according to claim 2, wherein said separation structures are connected to one another to form a lattice structure, having a plurality of openings in a position corresponding to said trenches.

12. The process according to claim 5, wherein said step of controlling the duration of said thickening thermal treatment comprises controlling said duration in such a manner that said suspended structure comprises a portion having, in a section orthogonal to said front face, substantially the shape either of a trapezium or of a triangle, with a height that is a function of said second thickness.

13. The process according to claim 8, wherein said thickening thermal treatment and said initial thermal treatment are performed in conditions and with parameters that are substantially identical, in particular in an atmosphere containing an inert gas and at a temperature of no less than 1000° C.

14. A method, comprising:
 forming in a monolithic semiconductor region having an outer surface a buried cavity sealed from the outer surface and having a portion of an inner surface that is a first distance from the outer surface; and
 shaping the cavity after forming the cavity such that the same portion of the inner surface has a second distance from the outer surface, the second distance greater than the first distance.

15. The method of claim 14 wherein forming the buried cavity comprises forming the buried cavity such that the inner surface is substantially parallel to the outer surface.

16. The method of claim 14, further comprising:
 forming pillars in the monolithic semiconductor region; and
 wherein forming the buried cavity comprises heating the pillars.

17. The method of claim 14 wherein the monolithic semiconductor region comprises a monolithic silicon region.

18. The method of claim 14 wherein shaping the cavity comprises:
 causing an inner portion of the inner surface to have the second distance from the outer surface; and
 causing an outer portion of the inner surface to have approximately the first distance from the outer surface.

19. The method of claim 14 wherein shaping the cavity comprises heating the monolithic semiconductor region.

20. A method, comprising:
 forming pillars in a monolithic semiconductor region having an outer surface;
 epitaxially growing semiconductor material over the pillars;
 forming a buried cavity in the monolithic semiconductor region by heating the pillars and the semiconductor material, the buried cavity having a portion of an inner surface that is a first distance from the outer surface; and
 shaping the cavity after forming the cavity such that the same portion of the inner surface has a second distance from the outer surface, the second distance greater than the first distance.

21. A method, comprising:
 forming in a monolithic semiconductor region having an outer surface a buried cavity having a portion of an inner surface that is a first distance from the outer surface; and
 shaping the cavity after forming the cavity such that the same portion of the inner surface has a second distance from the outer surface, the second distance greater than the first distance,
 wherein shaping the cavity comprises
  causing an inner portion of the inner surface to be substantially parallel to the outer surface, and
  causing an outer portion of the inner surface to slope away from the outer surface and toward the inner portion of the inner surface.

22. A method, comprising:
 forming in a monolithic semiconductor region having an outer surface a buried cavity having a portion of an inner surface that is a first distance from the outer surface; and
 shaping the cavity after forming the cavity such that the same portion of the inner surface has a second distance from the outer surface, the second distance greater than the first distance,
 wherein shaping the cavity comprises
  causing a first outer portion of the inner surface to slope away from the outer surface and toward an inner portion of the inner surface, and
  causing a second outer portion of the inner surface to slope away from the outer surface and toward the inner portion.

23. A method, comprising:
 forming in a monolithic semiconductor region having an outer surface a buried cavity sealed from the outer surface and having an inner surface that is substantially parallel to the outer surface; and
 shaping the cavity after forming the cavity such that the inner surface is not substantially parallel to the outer surface.

24. The method of claim 23 wherein forming the buried cavity comprises:
 forming trenches in the monolithic semiconductor region; and
 annealing the monolithic semiconductor region.

25. A method, comprising:
 forming in a monolithic semiconductor region having an outer surface a buried cavity having an inner surface that is substantially parallel to the outer surface; and
 shaping the cavity after forming the cavity such that the inner surface is not substantially parallel to the outer surface,
 wherein forming the buried cavity comprises
  forming trenches in the monolithic semiconductor region,
  epitaxially growing semiconductor material over the trenches, and
  annealing the monolithic semiconductor region.

26. A method, comprising:
 forming in a monolithic semiconductor region having an outer surface a buried cavity sealed from the outer surface and having a volume and an inner surface, a portion of the inner surface being a first distance from the outer surface; and
 shaping the cavity without substantially increasing the volume of the cavity such that after the shaping, the same portion of the inner surface is a second distance from the outer surface, the second distance being greater than the first distance.

* * * * *